(12) United States Patent
Tews et al.

(10) Patent No.: US 6,362,040 B1
(45) Date of Patent: Mar. 26, 2002

(54) REDUCTION OF ORIENTATION DEPENDENT OXIDATION FOR VERTICAL SIDEWALLS OF SEMICONDUCTOR SUBSTRATES

(75) Inventors: Helmut Horst Tews, Poughkeepsie; Brian S. Lee, New York, both of NY (US); Ulrike Gruening, Munich (DE); Raj Jammy, Wappingers Falls; John Faltermeier, LaGrange, both of NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/501,502

(22) Filed: Feb. 9, 2000

(51) Int. Cl.$^7$ .......................................... H01L 21/8242
(52) U.S. Cl. ................... 438/246; 438/243; 438/244; 438/245; 438/247; 438/248; 438/249; 438/386; 438/387; 438/388; 438/389; 438/390; 438/391; 438/392
(58) Field of Search .................. 438/243–249, 438/386–392

(56) References Cited

U.S. PATENT DOCUMENTS

| | | | | |
|---|---|---|---|---|
| 4,971,926 A | * | 11/1990 | Kinugawa | 438/382 |
| 5,026,659 A | * | 6/1991 | Lee | 438/244 |
| 5,057,444 A | * | 10/1991 | Fuse et al. | 438/524 |
| 5,183,775 A | * | 2/1993 | Levy | 438/386 |
| 5,867,420 A | | 2/1999 | Alsmeier | 365/149 |
| RE37,228 E | * | 6/2001 | Fuse et al. | 438/524 |

* cited by examiner

*Primary Examiner*—Charles Bowers
*Assistant Examiner*—Jennifer M. Kennedy

(57) ABSTRACT

A method for growing a dielectric layer on a substrate, in accordance with the present invention, includes the steps of providing a substrate having at least two crystallographic planes which experience different dielectric layer growth rates due to the at least two crystallographic planes. A first dielectric layer is grown on the at least two crystallographic planes such that the first dielectric layer has a first thickness on a first crystallographic plane and a second thickness on a second crystallographic plane. The first thickness is thicker than the second thickness for the first dielectric layer. Dopants are implanted through the first dielectric layer. A greater number of dopants are implanted in the substrate through the second thickness than through the first thickness of the first dielectric layer. The first dielectric layer is then removed. A second dielectric layer is grown at a same location as the removed first dielectric layer. The second dielectric layer has a first thickness on a first crystallographic plane and a second thickness on a second crystallographic plane. The first thickness and the second thickness of the second dielectric layer are closer in thickness than the first thickness and the second thickness of the first dielectric layer due to the implantation of the dopants.

31 Claims, 7 Drawing Sheets

REDUCTION OF ORIENTATION DEPENDENT OXIDATION FOR VERTICAL SIDEWALLS OF SEMICONDUCTOR SUBSTRATES

BACKGROUND

1. Technical Field

This disclosure relates to semiconductor fabrication and more particularly, to a method for oxidizing trench sidewalls which reduces crystallographic orientation dependence.

2. Description of the Related Art

Semiconductor devices employ silicon substrates on which to fabricate electronic devices. The structures fabricated on the substrate may include trenches for isolation regions, deep trenches for the formation of capacitor electrodes or other exposed vertical sidewalls of the substrate.

Sidewalls of the substrate may be oxidized to provide insulating layers. For silicon substrates, thermal oxidation may be employed to provide this insulation. The thermal oxidation rate on the vertical sidewalls of trenches depends on the silicon's crystal orientation of the trench sidewall. Thus, local oxidation of silicon (LOCOS oxidation) and gate oxidation processes for vertical transistors suffer from oxide thickness variations.

Referring to FIG. 1, a top view of a substrate 8 is shown having a trench 12 formed therein which has a thermally grown oxide layer 10 formed therein. Thermal oxidation 10 in trenches 12 leads to strong thickness variations due to the crystal plane orientation dependence of the oxidation. Typical thickness variations for thin oxides are approximately 40% for 900° C. dry oxidation processes between the (100) crystal plane 14 and the (110) crystal plane 16. For thick thermal oxidations, like the LOCOS oxidation, the thickness differences are even larger due to stress effects. If transistors have to be built at the trench sidewall, the oxide thickness variation leads to locally varying transistor properties and to weak points in the oxide during reliability stressing.

Therefore, a need exists for a method of reducing oxidation variations due to orientation dependent effects for thermal oxides formed for semiconductor devices.

SUMMARY OF THE INVENTION

A method for growing a dielectric layer on a substrate, in accordance with the present invention, includes the steps of providing a substrate having at least two crystallographic planes which experience different dielectric layer growth rates due to the at least two crystallographic planes. A first dielectric layer is grown on the at least two crystallographic planes such that the first dielectric layer has a first thickness on a first crystallographic plane and a second thickness on a second crystallographic plane. The first thickness is thicker than the second thickness for the first dielectric layer. Dopants are implanted through the first dielectric layer. A greater number of dopants are implanted in the substrate through the second thickness than through the first thickness of the first dielectric layer The first dielectric layer is then removed. A second dielectric layer is grown at a same location as the removed first dielectric layer. The second dielectric layer has a first thickness on a first crystallographic plane and a second thickness on a second crystallographic plane. The first thickness and the second thickness of the second dielectric layer are closer in thickness than the first thickness and the second thickness of the first dielectric layer due to the implantation of the dopants.

In other methods, the step of implanting may include the step of implanting dopants by employing one of ion implantation and plasma ion implantation. The substrate preferably includes mono-crystalline silicon and the first and second dielectric layer may include silicon oxide. The step of growing the first dielectric layer may include exposing the substrate to an oxygen ambient environment at a temperature greater than about 700 degrees C. The step of growing the second dielectric layer may include exposing the substrate to an oxygen ambient environment at a temperature greater than about 800 degrees C. The dopants may include one of halogens, oxygen, silicon and noble gases. The first thickness and the second thickness of the second dielectric layer may be substantially equal. The step of preventing dopants from penetrating through the first thickness of the first dielectric layer may also be included.

A method for growing an oxide layer on a substrate, in accordance with the present invention, includes providing a silicon substrate having a trench etched therein. The trench has sidewalls including at least two crystallographic planes which experience different dielectric layer growth. A sacrificial oxide layer is thermally grown on the at least two crystallographic planes such that the sacrificial oxide layer has a first thickness on a first crystallographic plane and a second thickness on a second crystallographic plane, wherein the first thickness is thicker than the second thickness. Dopants are implanted through the sacrificial oxide layer such that a greater number of dopants are implanted in the substrate through the second thickness than through the first thickness of the sacrificial oxide layer. The sacrificial oxide layer is removed, and an oxide dielectric layer is thermally grown in a location of the removed first dielectric layer such that the oxide dielectric layer grows faster on the second crystallographic plane than on the first crystallographic plane. The first thickness and the second thickness of the oxide dielectric layer are closer in thickness than the first thickness and the second thickness of the sacrificial oxide layer.

A method for growing an oxide layer on a substrate to prevent crystallographic orientation dependent thicknesses, in accordance with the invention, includes the steps of forming a hard mask on a top surface of a silicon substrate, patterning the hard mask and etching a trench in the substrate, the trench having sidewalls including at least two crystallographic planes which experience different dielectric layer growth, thermally growing a sacrificial oxide layer on the at least two crystallographic planes such that the sacrificial oxide layer has a first thickness on a first crystallographic plane and a second thickness on a second crystallographic plane, wherein the first thickness is thicker than the second thickness, implanting halogen dopants through the sacrificial oxide layer such that a greater number of dopants are implanted in the substrate through the second thickness than through the first thickness of the sacrificial oxide layer, the halogen dopants for promoting oxide growth, removing the sacrificial oxide layer, and thermally growing a oxide dielectric layer in a location of the removed first dielectric layer such that the oxide dielectric layer grows faster on the second crystallographic plane than on the first crystallographic plane due to the presence of the halogen dopants, such that the first thickness and second thickness of the oxide dielectric layer are closer in thickness than the first thickness and the second thickness of the sacrificial oxide layer.

In other methods, the step of implanting may include the step of implanting dopants by employing angled ion implantation to implant dopants below a top surface of the substrate. The angled ion implantation may include directing dopants at an angle of between 10 and 75 degrees relative to a surface normal of the top surface of the substrate. The step of implanting may include the step of rotating the substrate to implant dopants on all sidewalls of the trench. The step of implanting may include the step of implanting dopants by employing plasma ion implantation to implant dopants in the substrate.

In still other methods, the step of growing the sacrificial oxide layer may include exposing the substrate to an oxygen ambient environment at a temperature greater than about 700 degrees C. The step of growing the oxide dielectric layer may include exposing the substrate to an oxygen ambient environment at a temperature greater than about 800 degrees C. The dopants may include halogens, oxygen, silicon and/or noble gases. The first thickness and the second thickness of the oxide dielectric layer may be substantially equal. The method may include the step of preventing dopants from penetrating through the first thickness of the sacrificial oxide layer. The oxide dielectric layer may include a trench collar employed in deep trench capacitors. The oxide dielectric layer may include a gate oxide for vertical transistors.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention includes a method to achieve a constant oxide thickness on vertical sidewalls structures for thermally grown oxides. By ion implantation of species, the oxidation rate is enhanced in selected areas through a sacrificial screen oxide of crystal orientation-dependent thickness. Ions are implanted in sidewalls of a substrate by directing the ions into the substrate. By implanting ions at selected locations on the target sidewall, oxides are selectively grown at different rates thereby producing a uniform oxide layer during thermal oxidation processes.

Figure 1:
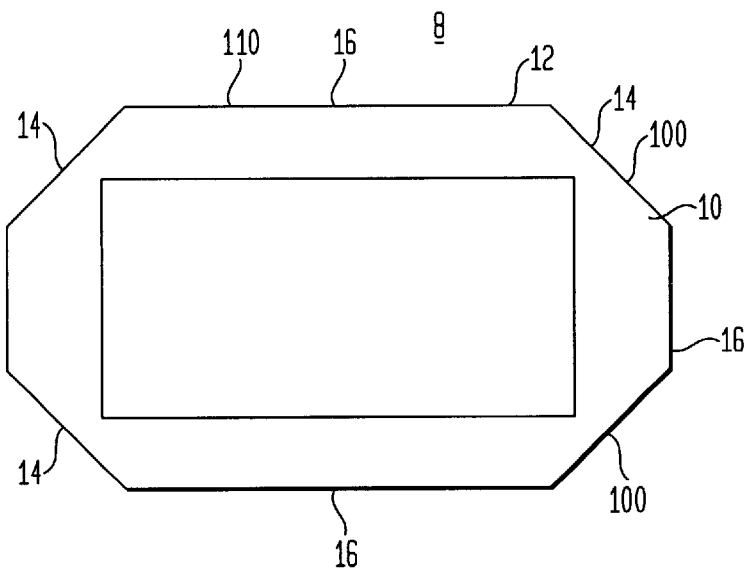
FIG. 1 is a top view of a prior art dielectric layer which suffers from crystal orientation dependence for a thickness of the layers.
Figure 2:
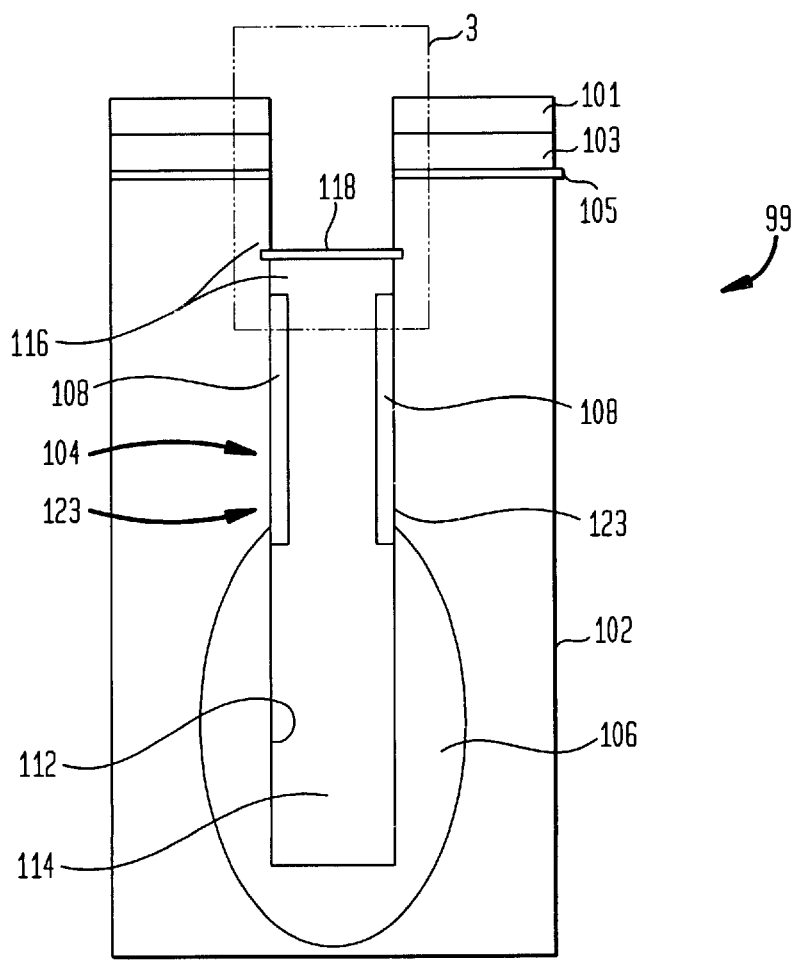
FIG. 2 is a cross-sectional view of a semiconductor device having a trench formed for a trench capacitor which will employ the present invention.

Referring now in specific detail to the drawings in which like reference numerals identify similar or identical elements throughout the several views, and initially to FIG. 2, a semiconductor device 99 includes a substrate 102. Device 99 may include a semiconductor memory, such as a dynamic random access memory (DRAM), a static random access memory (SRAM) or other memory devices. Device 99 may include other type of semiconductor devices, for example, application specific integrated circuits (ASICs). Substrate 102 preferably includes a monocrystalline silicon substrate. The present invention may also be employed with substrate materials which can sustain thermal oxide growth or other dielectric material growth.

In one illustrative embodiment, the present invention is employed to form a gate oxide for a vertical transistor. Substrate 102 is etched to form a trench 104 therein by forming trenches 104 in accordance with a hard mask pattern of a patterned hard mask 101. A pad nitride layer 103 and pad oxide layer 105 may also be included. A buried plate 106 is formed in a lower portion of trench 104 to provide a plate for a deep trench capacitor which will be formed in trench 104. Buried plate 106 is formed by implanting dopants in the region surrounding trench 104 as is known in the art.

A collar 108 is formed in trench on sidewalls 123 in an upper portion of trench 104. Collar 108 is employed to prevent current leakage from trench 104 when a trench capacitor is formed within trench 104. Collar 108 may include an oxide layer, such as TEOS (tetra-oxo-ethyl silane) or other oxides.

Collar 108 may also be formed by employing an oxide layer in accordance with the invention or a deposited oxide layer which is etched to provide proper placement of collar 108. After collar 108 has been formed, a node dielectric layer 112 is deposited in trench 104. Node dielectric layer 112 preferably includes a thin layer (about 5 nm) of silicon nitride. Node dielectric 112 lines sidewalls 123 and collar 108 and functions as a capacitor dielectric layer between buried plate 106 and a conductive material 114 which is formed in trench 104.

Conductive material 114 preferably includes polysilicon which is deposited in trench 104 and recessed into trench 104. Conductive material 114 functions as a capacitor electrode. Conductive material 114 is connected to a diffusion region of a transistor by a buried strap 116. Buried strap 116 includes outdiffused dopants which have diffused into substrate 102 adjacent to conductive material 114. A trench top layer 118 is formed on conductive material 114 to isolate material 114 from a gate conductor to be formed in trench 104.

Figure 3:
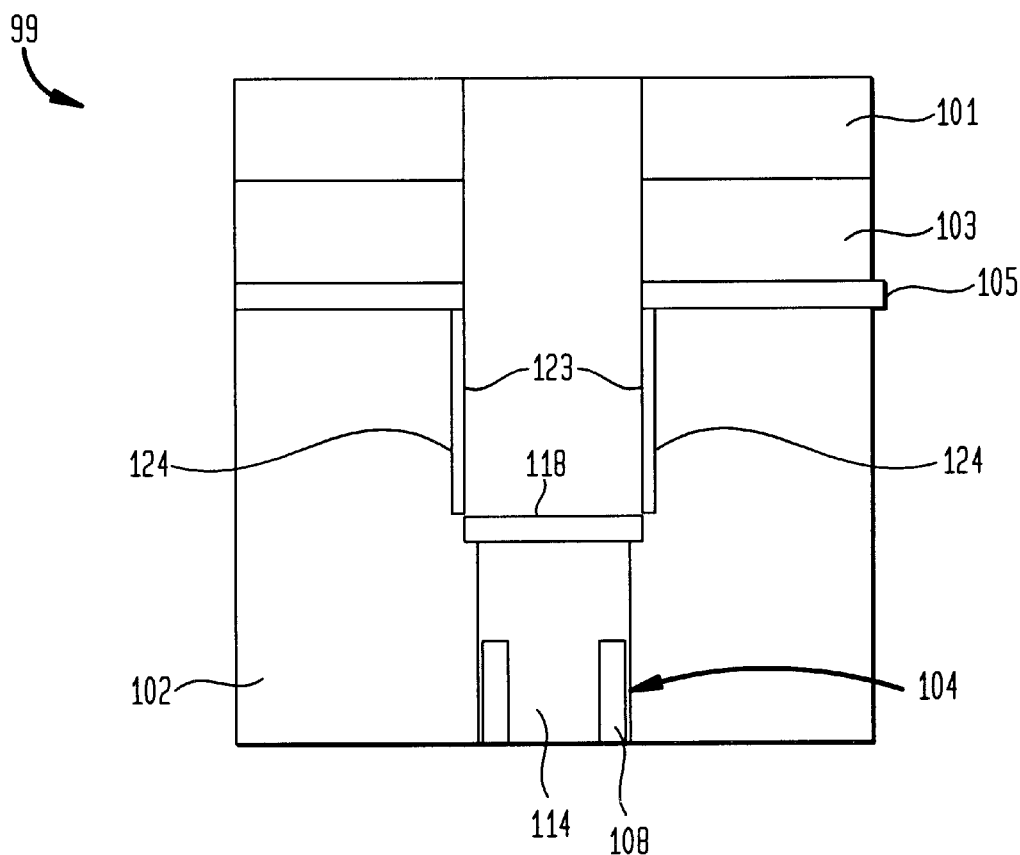
FIG. 3 is a magnified cross-sectional view of detail 3 of FIG. 2 showing a sacrificial layer formed in accordance with the present invention.
Figure 4:
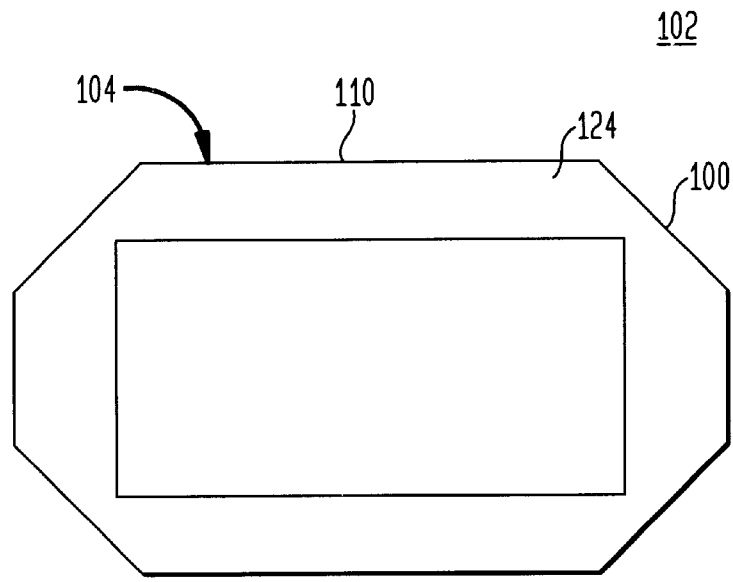
FIG. 4 is a top view of the sacrificial dielectric layer of FIG. 3 in accordance with the present invention.

Referring to FIGS. 3 and 4, sidewalls 123 of an upper portion of trench 104 are exposed. Hard mask layer 101 which may include an oxide on top of a pad nitride layer 103 and pad oxide layer 105 which are present on a top horizontal surface of substrate 102. The upper part of trench 104 will include a gate electrode for a vertical transistor at its sidewall; therefore, a gate dielectric layer (preferably of oxide) needs to be formed on sidewall 123. A sacrificial layer 124, preferably a thermal oxide, is formed on sidewalls 123 by exposing sidewalls 123 to an oxygen ambient environment at elevated temperatures. In one embodiment, the temperatures are maintained between about 700° C. to about 900° C. to grow an oxide with a thickness of about 30 □ to about 50 □ in thin areas of layer 124 and a thickness of about 60 □ to about 100 □ in thick areas of layer 124. Layer 124 is dependent on crystal orientations of substrate 102. If substrate 102 includes silicon and layer 124 is an oxide, then crystal planes (110) and (100) form an oxide of different thicknesses on vertical sidewalls of substrate 102. In this way, oxide layer 124 is achieved having different thicknesses in accordance with the crystal plane on which the oxide is formed, as shown in FIG. 4. Sacrificial thermal oxide 124 provides sufficient thickness to accept dopants into sidewalls 123 (FIG. 3) at selected locations by employing plasma implantation or low energy angled implantation of dopants as will be explained below.

Figure 5:
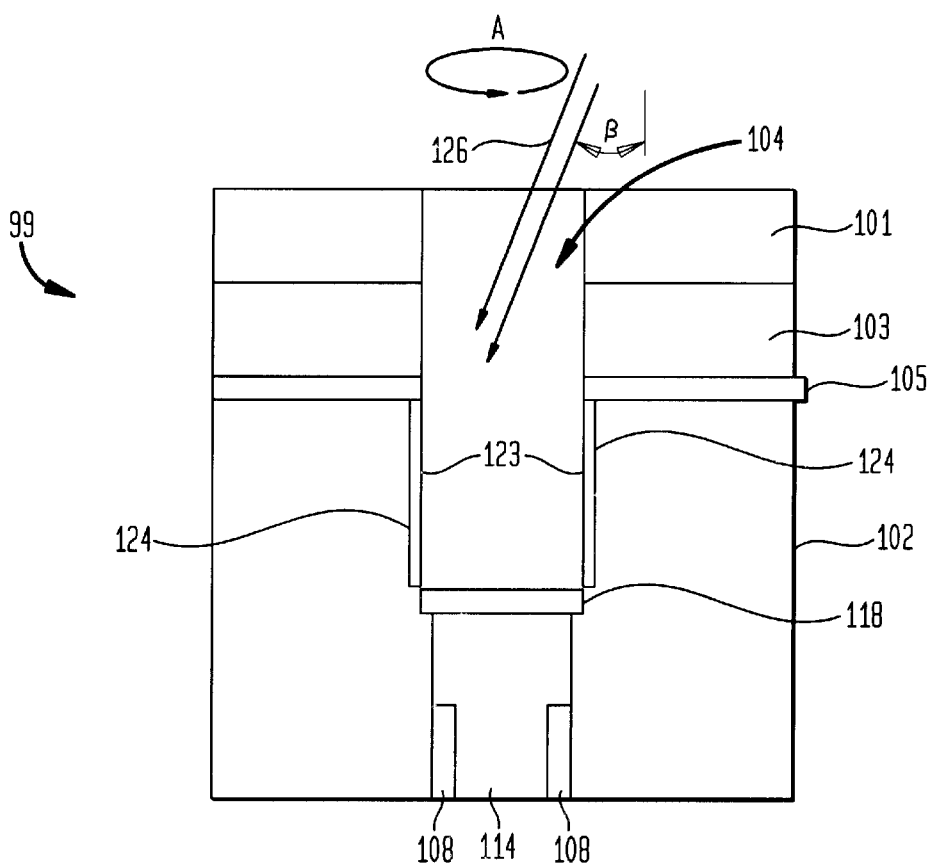
FIG. 5 is a cross-sectional view of the semiconductor device of FIG. 3 showing the sacrificial layer employed as a dopant mask in accordance with the present invention.

Referring to FIG. 5, in accordance with the present invention, dopants are implanted into sidewalls 123 through sacrificial thermal oxide 124. Low energy angled ion implantation or plasma ion implantation may be employed to direct dopants (ions) 126 to damage he surface of sidewalls 123. Dopants 126 preferably include halogens, such as F or Br, oxygen and/or silicon. Dopants may also include noble gases, such as He or Ar. The ion species of dopants 126 enhance the oxidation rate in a subsequent oxidation step which will be described below. The energy employed to implant dopants into sidewall 123 depends on the thickness of sacrificial layer 124.

Advantageously, sacrificial layer 124 includes orientation dependent thicknesses (see FIG. 4). Ions 126 are implanted into sidewalls 123 at the (100) planes where sacrificial layer 124 is thin. At the (110) planes, sacrificial layer 124 is thick preventing the ions from reaching sidewalls 123 or at least reducing the concentration of dopants 126 at these locations. Plasma ion or ion implantation may include providing ions having an implanted dose of between about $1 \times 10^{14}$ atoms/cm$^3$ and about $1 \times 10^{15}$ atoms/cm$^3$ with a horizontal energy component of between about 5 keV and about 10 keV. Sacrificial layer 124 may include a thickness of between 30 □ to about 50 □ for (100) planes and a thickness of about 60 □ to about 100 □ for (110) planes. One skilled in the art understands that implantation energies and doses need to account for angled implantation to achieve appropriate implanted doses and implantation depths.

If ion implantation is employed for holes (e.g., deep trenches), semiconductor device 99 is preferably rotated (Arrow "A") to provide dopant implantation on all sidewalls thereof. Implantation is directed at an angle β which can be varied to provide dopant implantation at different depths on sidewalls 123. In one embodiment, β may be between about 10 degrees to about 75 degrees. In preferred embodiments, β is set at a given angle and maintained at that angle throughout the implantation, although β may be varied during implantation as well.

Advantageously, dopants 126 are self-aligned to sidewalls 123, since other areas are masked by hard mask 101 or trench top layer 118. Sacrificial layer 124 acts as a self-aligned mask for the ion implantation. This means that crystallographic orientations of the trench or hole are accounted for by layer 124 despite the orientation of the trench or hole relative to crystal planes of substrate 102. After implantation, sacrificial layer 124 is removed by a wet etching process, such as an HF etch or a dry etching process such as chemical dry etching (CDE). Left behind in sidewalls 123 at selected locations (e.g., (110) planes in silicon) are dopants 126 which will now be employed to adjust oxide growth rates.

Figure 6:
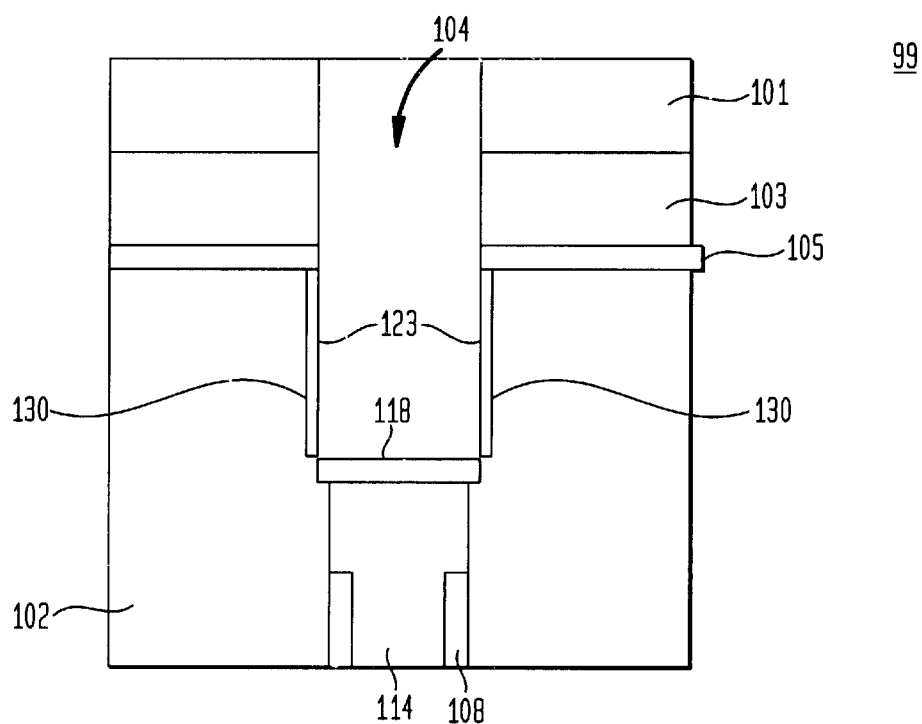
FIG. 6 is a cross-sectional view of the semiconductor device of FIG. 5 showing a dielectric layer employed for a gate dielectric after the sacrificial layer is removed in accordance with the present invention.
Figure 7:
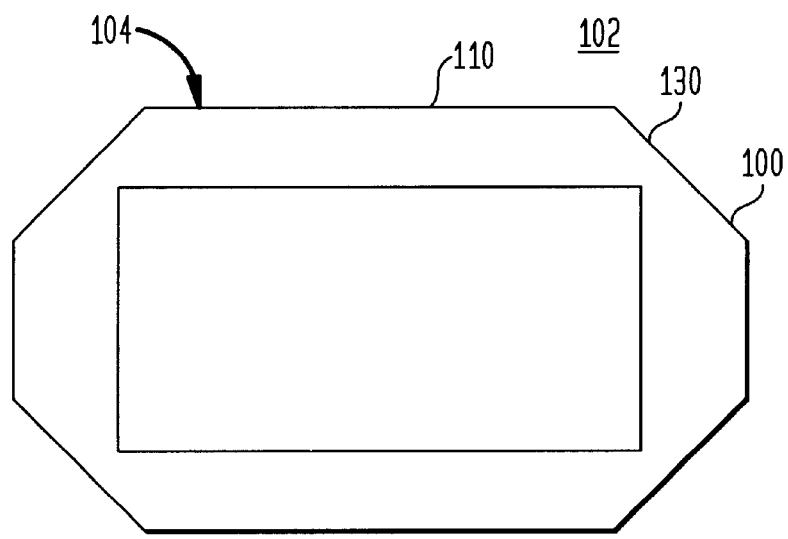
FIG. 7 is a top view of the dielectric layer of FIG. 6 in accordance with the present invention.

Referring to FIG. 6, a thermal layer 130, preferably oxide, is formed on sidewalls 123 by exposing sidewalls 123 to an oxygen ambient environment at elevated temperatures. In one embodiment, the temperature is maintained between about 800° C. to about 1100° C. to grow an oxide with a thickness of about 30 □ to about 100 □. This oxide 130 is dependent on crystal orientations of substrate 102; however, since selected areas of sidewalls 123 have been doped, with dopants 126, thermal oxidation occurs at a faster growth rate at locations having dopants implanted therein. The effect of the implantation is to enhance the growth rates. The (100) planes with the smallest growth rates have the highest implanted dose and thus the highest increase in oxidation rate (See FIG. 7). Referring to FIG. 7, a top view of a trench 104 formed in a silicon substrate 102 is shown in accordance with the present invention. Variations in thickness of oxide layer 130 are significantly reduced to provide a substantially uniform thickness inside trench 104. Oxide layer 130 may include a thickness of between about 30 □ to about 100 □.

Figure 8:
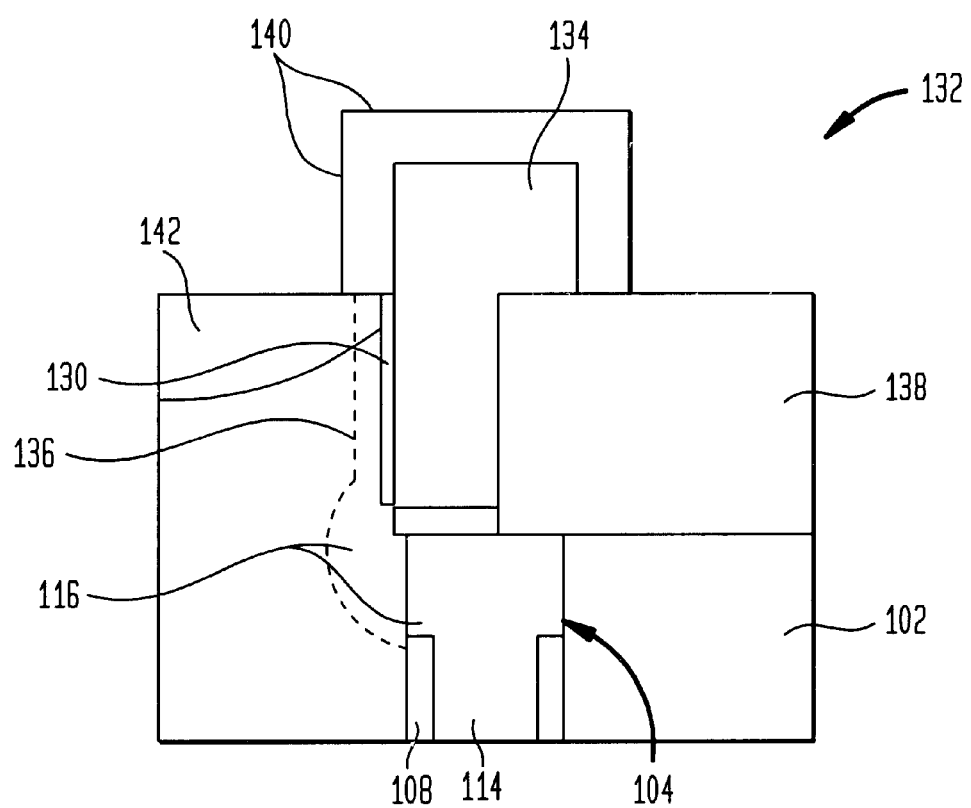
FIG. 8 is a cross-sectional view of the semiconductor device of FIG. 6 showing a gate conductor formed over the gate dielectric grown in accordance with the present invention.

Referring to FIG. 8, oxide layer 130 forms a gate oxide employed for forming a vertical transistor 132. A gate conductor 134 is deposited into trench 104 and a conduction channel 136 is formed in substrate 102 adjacent to trench 104 for charging and discharging a storage capacitor formed in trench 104. An isolation structure 138 may be formed adjacent to and partially filling trench 104. A cap and spacers 140 may be employed to insulate gate conductor 134 (e.g., a wordline). Channel 136 conducts when gate conductor 134 is activated, permitting a conductive path between diffusion region 142 and buried strap 116.

Figure 9:
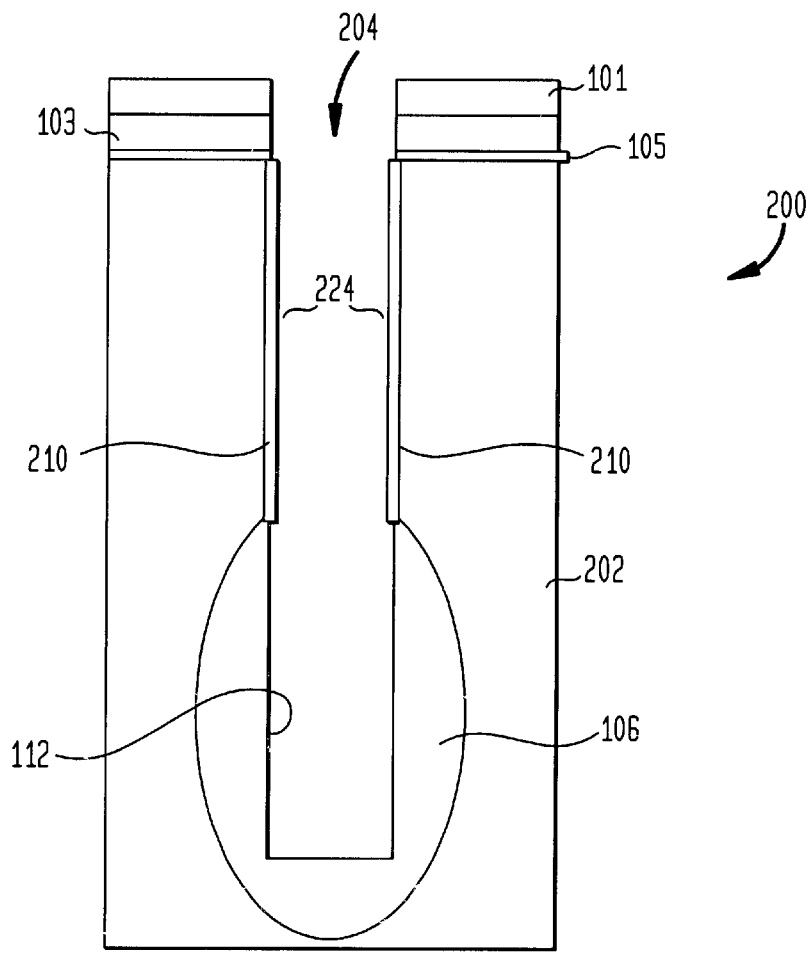
FIG. 9 is a cross-sectional view of another semiconductor device having a trench formed in a substrate having a sacrificial layer formed along sidewalls thereof in accordance with the present invention.
Figure 10:
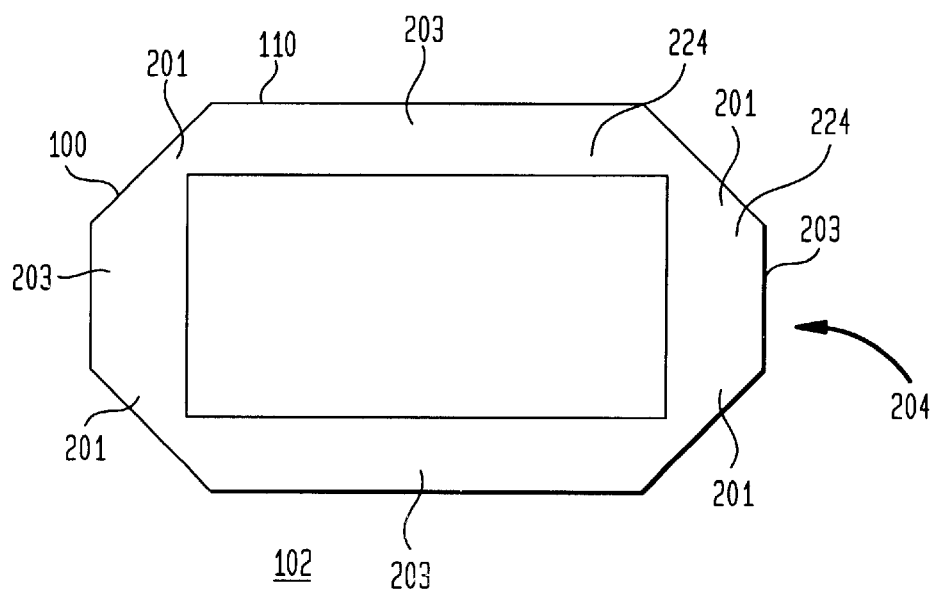
FIG. 10 is a top view of the sacrificial dielectric layer of FIG. 9 in accordance with the present invention.

Referring to FIGS. 9 and 10, in another illustrative embodiment of the present invention, a collar 208 (FIG. 12) is formed on sidewalls 210 of a trench 204 of a semiconductor device 200. Device 200 may include a semiconductor memory, such as a dynamic random access memory (DRAM), a static random access memory (SRAM) or other memory devices. Device 200 may include other type of semiconductor devices, for example, application specific integrated circuits (ASICs). Trench 204 is etched into substrate 102 preferably by an anisotropic etch process, for example, a reactive ion etch (RIE) process, employing a hard mask 101 to locate trenches 204.

A sacrificial layer 224 is formed on sidewalls 210 of trench 204. A low temperature thermal oxidation can be used to create sacrificial layer 224, which is employed as a mask to dopant implantation. The low temperature thermal oxidation process may include temperatures between about 700° C. and about 900° C., in an ambient environment including oxygen. The time for the oxidation is dependent on the thickness desired for oxide layer 224. The thickness of oxide layer 224 is determined based on the implantation parameters as will be discussed below.

Due to crystallographic dependence, layer 224 includes different thicknesses. Advantageously, this crystallographic dependence is employed to permit a higher concentration of dopants to enter sidewalls 210 at thinner areas 201 and little or no dopants entering sidewalls at thicker areas 203 of layer 224.

Figure 11:
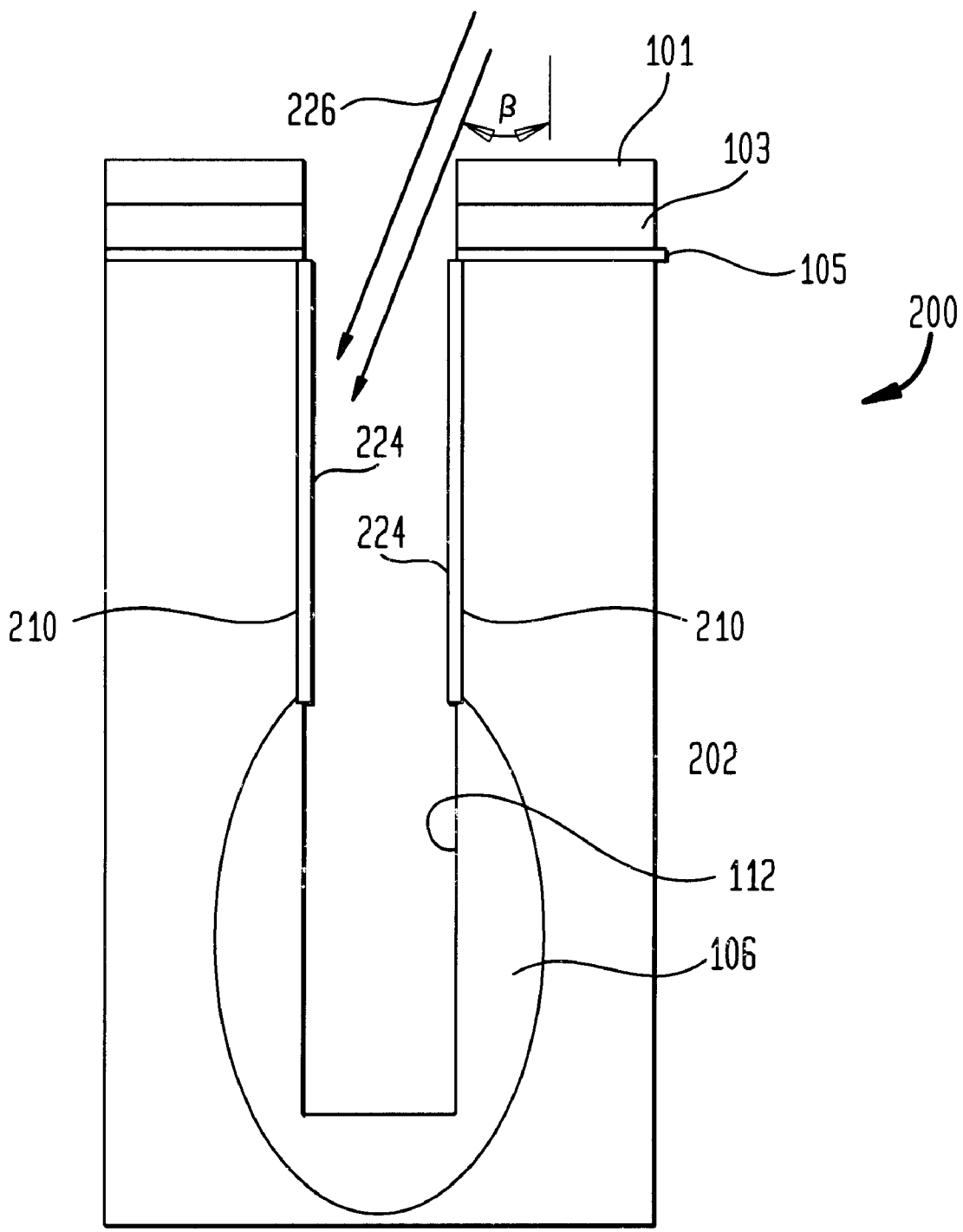
FIG. 11 is a cross-sectional view of the semiconductor device of FIG. 9 showing the sacrificial layer employed as a dopant mask in accordance with the present invention.

Referring to FIG. 11, plasma implantation or angled ion implantation of halogen ions or other species of dopants 226 which enhance the oxidation rate is performed in a similar manner as described above. Since collar formation is deeper into trench 204, angle β is preferably maintained at a higher value to reach deeper positions in trench 204, if angled ion implantation is employed.

After implantation, sacrificial layer 224 is removed by a wet etching process, such as an HF etch or a dry etching process such as chemical dry etching (CDE). Left behind in sidewalls 210 at selected locations (e.g., (110) planes in silicon) are dopants 226 which will now be employed to adjust oxide growth rates.

Figure 12:
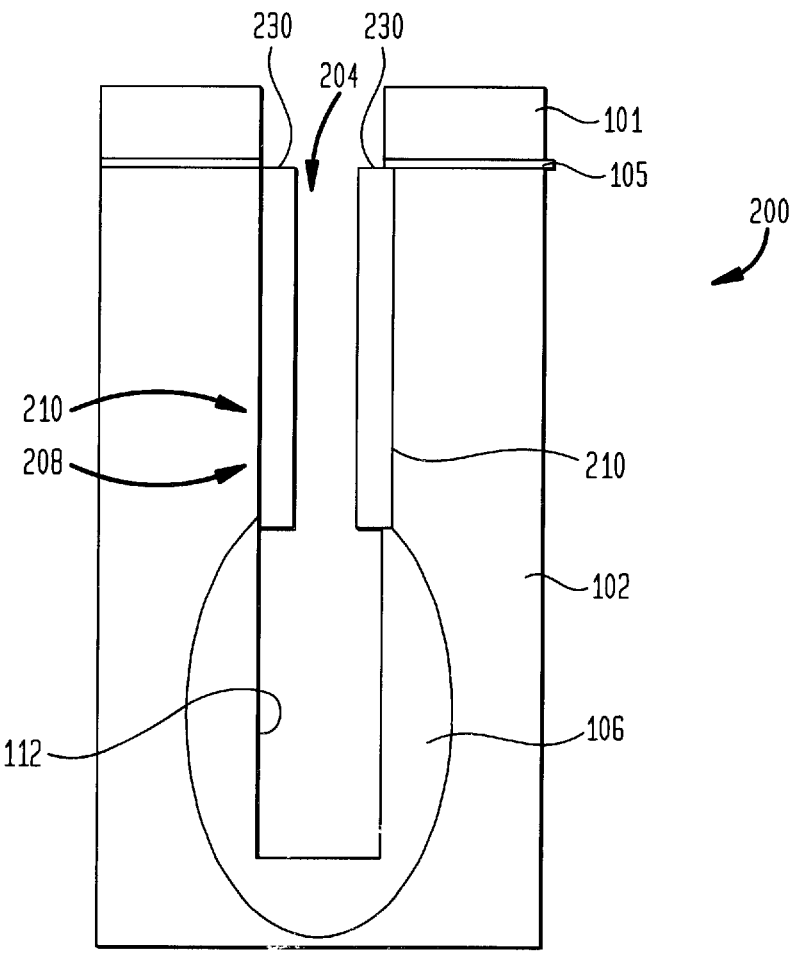
FIG. 12 is a cross-sectional view of the semiconductor device of FIG. 11 showing a dielectric layer employed for a trench collar after the sacrificial layer is removed in accordance with the present invention.

Referring to FIG. 12, a dielectric layer 230, preferably a thermal oxide, is grown on sidewalls 210 by exposing sidewalls 210 to an oxygen ambient environment at elevated temperatures. In one embodiment, the temperature is maintained between about 800° C. to about 1100° C. to grow an oxide with a thickness of about 100 □ to about 500 □. This oxide 230 is dependent on crystal orientations of substrate 102; however, since selected areas of sidewalls 210 have been doped, with dopants 226, thermal oxidation occurs at a faster growth rate at locations having a higher concentration of dopants implanted therein. The effect of the implantation is to enhance the growth rates in areas which would have been thinner due to crystallographic dependencies. For example, the (100) planes with the smallest growth rates have the highest implanted dose and thus the highest increase in oxidation rate. Oxide layer 130 may be formed by employing a local oxidation of silicon (LOCOS) process. Oxide layer 230 may be recessed to form a collar 208 for a deep trench capacitor.

Figure 13:
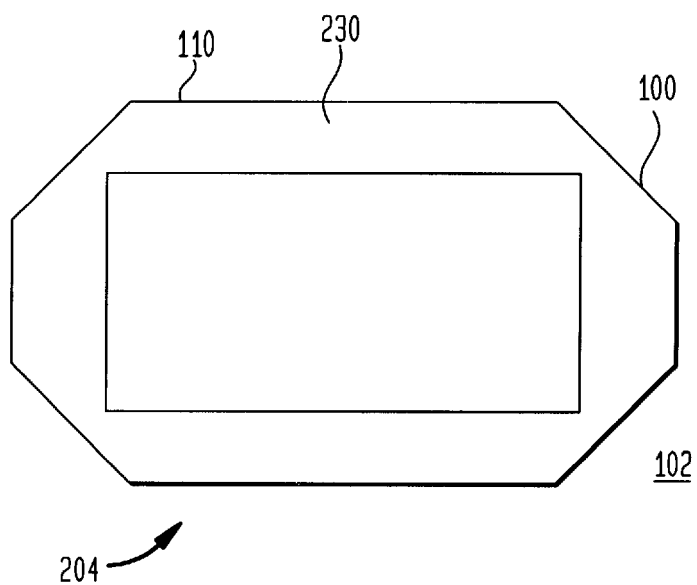
FIG. 13 is a top view of the dielectric layer of FIG. 12 in accordance with the present invention.

Referring to FIG. 13, a top view of a trench 204 formed in a silicon substrate 202 is shown in accordance with the present invention. Variations in thickness of oxide layer 230 are significantly reduced to provide a substantially uniform thickness inside trench 204. Oxide layer 230 may include a thickness of between about 100 □ to about 500 □.

It should be understood that the present invention may include applications other than those described above. For example, on other substrates having different crystallographic planes, for example, gallium arsenide or germanium substrates, may provide different dielectric layer growth rates. Further, although thermal oxides are described other reactive gases may be employed to form dielectric layers. For example, nitrogen may be employed to form nitride layers.

Having described preferred embodiments for a reduction of orientation dependent oxidation for vertical sidewalls of semiconductor substrates (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for growing a dielectric layer on a substrate comprising the steps of:

providing a substrate having at least two crystallographic planes which experience different dielectric layer growth rates due to the at least two crystallographic planes;

growing a first dielectric layer on the at least two crystallographic planes such that the first dielectric layer has a first thickness on a first crystallographic plane and a second thickness on a second crystallographic plane, wherein the first thickness is thicker than the second thickness;

implanting dopants through the first dielectric layer such that a greater number of dopants are implanted in the substrate through the second thickness than through the first thickness of the first dielectric layer; and removing the first dielectric layer;

growing a second dielectric at a same location as the removed first dielectric layer such that the second dielectric layer has a first thickness on a first crystallographic plane and a second thickness on a second crystallographic plane, wherein the first thickness and the second thickness of the second dielectric layer are closer in thickness than the first thickness and the second thickness of the first dielectric layer due to the implantation of the dopants.

2. The method as recited in claim 1, wherein the step of implanting includes the step of implanting dopants by employing one of ion implantation and plasma ion implantation.

3. The method as recited in claim 1, wherein the substrate includes mono-crystalline silicon and the first and second dielectric layer include silicon oxide.

4. The method as recited in claim 1, wherein the step of growing the first dielectric layer includes exposing the substrate to an oxygen ambient environment at a temperature greater than about 700 degrees C.

5. The method as recited in claim 1, wherein the step of growing the second dielectric layer includes exposing the substrate to an oxygen ambient environment at a temperature greater than about 800 degrees C.

6. The method as recited in claim 1, wherein the dopants include one of halogens, oxygen, silicon and noble gases.

7. The method as recited in claim 1, wherein the first thickness and the second thickness of the second dielectric layer are substantially equal.

8. The method as recited in claim 1, further comprising the step of preventing dopants from penetrating through the first thickness of the first dielectric layer.

9. A method for growing an oxide layer on a substrate comprising the steps of:

providing a silicon substrate having a trench etched therein, the trench having sidewalls including at least two crystallographic planes which experience different dielectric layer growth;

thermally growing a sacrificial oxide layer on the at least two crystallographic planes such that the sacrificial oxide layer has a first thickness on a first crystallographic plane and a second thickness on a second crystallographic plane, wherein the first thickness is thicker than the second thickness;

implanting dopants through the sacrificial oxide layer such that a greater number of dopants are implanted in the substrate through the second thickness than through the first thickness of the sacrificial oxide layer;

removing the sacrificial oxide layer; and thermally growing an oxide dielectric layer in a location of the removed first dielectric layer such that the oxide dielectric layer grows faster on the second crystallographic plane than on the first crystallographic plane, such that the first thickness and the second thickness of the oxide dielectric layer are closer in thickness than the first thickness and the second thickness of the sacrificial oxide layer.

10. The method as recited in claim 9, wherein the step of implanting includes the step of implanting dopants by employing angled ion implantation to implant dopants below a top surface of the substrate.

11. The method as recited in claim 10, wherein the angled ion implantation includes directing dopants at an angle of between 10 and 75 degrees relative to a surface normal of the top surface of the substrate.

12. The method as recited in claim 10, wherein the step of implanting includes the step of rotating the substrate to implant dopants on all sidewalls of the trench.

13. The method as recited in claim 9, wherein the step of implanting includes the step of implanting dopants by employing plasma ion implantation to implant dopants in the substrate.

14. The method as recited in claim 9, wherein the step of growing the sacrificial oxide layer includes exposing the substrate to an oxygen ambient environment at a temperature greater than about 700 degrees C.

15. The method as recited in claim 9, wherein the step of growing the oxide dielectric layer includes exposing the substrate to an oxygen ambient environment at a temperature greater than about 800 degrees C.

16. The method as recited in claim 9, wherein the dopants include one of halogens, oxygen, silicon and noble gases.

17. The method as recited in claim 9, wherein the first thickness and the second thickness of the oxide dielectric layer are substantially equal.

18. The method as recited in claim 9, further comprising the step of preventing dopants from penetrating through the first thickness of the sacrificial oxide layer.

19. The method as recited in claim 9, wherein the oxide dielectric layer includes a trench collar employed in deep trench capacitors.

20. The method as recited in claim 9, wherein the oxide dielectric layer includes a gate oxide for vertical transistors.

21. A method for growing an oxide layer on a substrate to prevent crystallographic orientation dependent thicknesses comprising the steps of:

forming a hard mask on a top surface of a silicon substrate;

patterning the hard mask and etching a trench in the substrate, the trench having sidewalls including at least two crystallographic planes which experience different dielectric layer growth;

thermally growing a sacrificial oxide layer on the at least two crystallographic planes such that the sacrificial oxide layer has a first thickness on a first crystallographic plane and a second thickness on a second crystallographic plane, wherein the first thickness is thicker than the second thickness;

implanting halogen dopants through the sacrificial oxide layer such that a greater number of dopants are implanted in the substrate through the second thickness than through the first thickness of the sacrificial oxide layer, the halogen dopants for promoting oxide growth;

removing the sacrificial oxide layer; and thermally growing an oxide dielectric layer in a location of the removed first dielectric layer such that the oxide dielectric layer grows faster on the second crystallographic plane than on the first crystallographic plane due to the presence of the halogen dopants, such that the first thickness and the second thickness of the oxide dielectric layer are closer in thickness than the first thickness and the second thickness of the sacrificial oxide layer.

22. The method as recited in claim 21, wherein the step of implanting includes the step of implanting dopants by employing angled ion implantation to implant dopants below a top surface of the substrate.

23. The method as recited in claim 22, wherein the angled ion implantation includes directing dopants at an angle of between 10 and 75 degrees relative to a surface normal of the top surface of the substrate.

24. The method as recited in claim 22, wherein the step of implanting includes the step of rotating the substrate to implant dopants on all sidewalls of the trench.

25. The method as recited in claim 21, wherein the step of implanting includes the step of implanting one of halogen, oxygen, silicon and noble gas dopants by employing plasma ion.

26. The method as recited in claim 21, wherein the step of growing the sacrificial oxide layer includes exposing the substrate to an oxygen ambient environment at a temperature greater than about 700 degrees C.

27. The method as recited in claim 21, wherein the step of growing the oxide dielectric layer includes exposing the substrate to an oxygen ambient environment at a temperature greater than about 800 degrees C.

28. The method as recited in claim 21, wherein the first thickness and the second thickness of the oxide dielectric layer are substantially equal.

29. The method as recited in claim 21, further comprising the step of preventing dopants from penetrating through the first thickness of the sacrificial oxide layer.

30. The method as recited in claim 21, wherein the oxide dielectric layer includes a trench collar employed in deep trench capacitors.

31. The method as recited in claim 21, wherein the oxide dielectric layer includes a gate oxide for vertical transistors.

* * * * *